(12) United States Patent
Li et al.

(10) Patent No.: US 10,566,943 B2
(45) Date of Patent: *Feb. 18, 2020

(54) APPARATUS AND METHODS FOR BIASING OF POWER AMPLIFIERS

(71) Applicant: SKYWORKS SOLUTIONS, INC., Woburn, MA (US)

(72) Inventors: Ping Li, Dunstable, MA (US); Paul T. DiCarlo, Marlborough, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 17 days.

This patent is subject to a terminal disclaimer.

(21) Appl. No.: 15/906,219

(22) Filed: Feb. 27, 2018

(65) Prior Publication Data
US 2018/0302054 A1 Oct. 18, 2018

Related U.S. Application Data

(63) Continuation of application No. 15/377,842, filed on Dec. 13, 2016, now Pat. No. 9,917,563, which is a
(Continued)

(51) Int. Cl.
*H03G 3/30* (2006.01)
*H03F 3/21* (2006.01)
(Continued)

(52) U.S. Cl.
CPC ......... *H03G 3/3042* (2013.01); *H03F 1/0205* (2013.01); *H03F 3/19* (2013.01);
(Continued)

(58) Field of Classification Search
USPC .................. 330/285, 296, 288–289
See application file for complete search history.

(56) References Cited

U.S. PATENT DOCUMENTS 6,331,799 B1 12/2001 Miyazawa
6,873,211 B1 3/2005 Thompson et al.
(Continued)

FOREIGN PATENT DOCUMENTS

CN   101414805 A   4/2009
JP   2000-252766   9/2000
(Continued)

OTHER PUBLICATIONS

Yoon, S., Kim, C. "2.4 GHz WLAN InGaP/GaAs Power Amplifier with Temperature Compensation Technique" ETRI Journal, vol. 31, No. 5., Oct. 2009, 3 pages.
(Continued)

*Primary Examiner* — Hieu P Nguyen
(74) *Attorney, Agent, or Firm* — Knobbe, Martens, Olson & Bear, LLP

(57) ABSTRACT

Apparatus and methods for biasing of power amplifiers are disclosed. In one embodiment, a mobile device includes a transceiver that generates a radio frequency signal and a power amplifier enable signal, a power amplifier that provides amplification to the radio frequency signal and that is biased by a bias signal, and a bias circuit that receives the power amplifier enable signal and generates the bias signal. The bias circuit includes a gain correction circuit that generates a correction current in response to activation of the power amplifier enable signal, and a primary biasing circuit that generates the bias signal based on the correction current and the power amplifier enable signal.

20 Claims, 7 Drawing Sheets

Related U.S. Application Data continuation of application No. 14/825,053, filed on Aug. 12, 2015, now Pat. No. 9,667,203, which is a continuation of application No. 14/242,150, filed on Apr. 1, 2014, now Pat. No. 9,136,803, which is a continuation of application No. 13/468,749, filed on May 10, 2012, now Pat. No. 8,717,101.

(60) Provisional application No. 61/486,186, filed on May 13, 2011.

(51) Int. Cl.
  H03F 1/02      (2006.01)
  H03F 3/24      (2006.01)
  H03F 3/19      (2006.01)
  H03F 3/213     (2006.01)
  H03F 3/195     (2006.01)
  H04B 1/3827    (2015.01)
  H03G 3/00      (2006.01)

(52) U.S. Cl.
  CPC ......... *H03F 3/195* (2013.01); *H03F 3/21* (2013.01); *H03F 3/211* (2013.01); *H03F 3/213* (2013.01); *H03F 3/24* (2013.01); *H03G 3/007* (2013.01); *H04B 1/3827* (2013.01); *H03F 2200/129* (2013.01); *H03F 2200/18* (2013.01); *H03F 2200/336* (2013.01); *H03F 2200/387* (2013.01); *H03F 2200/451* (2013.01)

(56) References Cited

U.S. PATENT DOCUMENTS

| | | | |
|---|---|---|---|
| 6,922,107 B1 * | 7/2005 | Green | H03F 1/302 330/285 |
| 7,064,614 B2 | 6/2006 | Feng et al. | |
| 7,215,203 B2 | 5/2007 | Matsunaga et al. | |
| 7,345,547 B2 | 3/2008 | Wang et al. | |
| 7,439,806 B2 | 10/2008 | Dow | |
| 7,567,123 B2 | 7/2009 | Leung et al. | |
| 7,777,566 B1 | 8/2010 | Drogi et al. | |
| 7,795,980 B2 | 9/2010 | Griffiths et al. | |
| 7,821,335 B2 | 10/2010 | Shiramizu et al. | |
| 7,869,775 B2 | 1/2011 | Alon et al. | |
| 7,876,157 B1 | 1/2011 | Kang et al. | |
| 7,928,804 B2 | 4/2011 | Yamamoto et al. | |
| 8,666,339 B2 | 3/2014 | Yu et al. | |
| 8,692,619 B2 | 4/2014 | Wakita et al. | |
| 8,717,101 B2 | 5/2014 | Li et al. | |
| 9,136,803 B2 | 9/2015 | Li et al. | |
| 9,503,026 B2 | 11/2016 | Li et al. | |
| 9,667,203 B2 | 5/2017 | Li et al. | |
| 9,917,563 B2 | 3/2018 | Li et al. | |
| 10,135,397 B2 * | 11/2018 | Tai | H03F 1/0227 |
| 2003/0016082 A1 | 1/2003 | Matsunaga et al. | |
| 2005/0032488 A1 | 2/2005 | Pehlke et al. | |
| 2005/0134374 A1 | 6/2005 | Hench et al. | |
| 2007/0024372 A1 | 2/2007 | Hagen | |
| 2008/0180169 A1 | 7/2008 | Ripley et al. | |
| 2009/0195318 A1 | 8/2009 | Kang et al. | |
| 2009/0212863 A1 | 8/2009 | Ishimaru | |
| 2010/0156539 A1 | 6/2010 | Ha et al. | |
| 2011/0134664 A1 | 6/2011 | Berghegger | |
| 2012/0286873 A1 | 11/2012 | Li | |
| 2013/0141167 A1 | 6/2013 | Kim et al. | |
| 2013/0307625 A1 | 11/2013 | Hershberger et al. | |
| 2013/0307627 A1 | 11/2013 | Hershberger | |
| 2015/0035605 A1 | 2/2015 | Lam | |
| 2015/0077187 A1 | 3/2015 | Lam et al. | |
| 2015/0180518 A1 | 6/2015 | Whittaker | |
| 2015/0349730 A1 | 12/2015 | Li et al. | |

FOREIGN PATENT DOCUMENTS

| | | |
|---|---|---|
| JP | 2007-019784 | 1/2007 |
| TW | 200746621 | 12/2007 |
| TW | 200810347 | 2/2008 |

OTHER PUBLICATIONS

SiGe Semiconductor, Inc. "5 GHz Power Amplifier with Power Detector", SE2537L, DST-00097, Rev 1.5, Mar. 22, 2010, 10 pages.
Search Report and Written Opinion dated Nov. 28, 2012 for International Application No. PCT/US2012/037065. 11 pages.

* cited by examiner

APPARATUS AND METHODS FOR BIASING OF POWER AMPLIFIERS

CROSS-REFERENCE TO RELATED APPLICATIONS

This application is a continuation of U.S. patent application Ser. No. 15/377,842, filed Dec. 13, 2016 titled "APPARATUS AND METHODS FOR BIASING OF POWER AMPLIFIERS," which is a continuation of U.S. patent application Ser. No. 14/825,053, filed Aug. 12, 2015 titled "APPARATUS AND METHODS FOR POWER AMPLIFIER BIASING," which is a continuation of U.S. patent application Ser. No. 14/242,150, filed Apr. 1, 2014, titled "APPARATUS AND METHODS FOR BIASING A POWER AMPLIFIER," which is a continuation of U.S. patent application Ser. No. 13/468,749, filed May 10, 2012, titled "APPARATUS AND METHODS FOR BIASING POWER AMPLIFIERS," which claims the benefit of priority under 35 U.S.C. § 119(e) of U.S. Provisional Patent Application No. 61/486,186, filed May 13, 2011 titled "APPARATUS AND METHODS FOR BIASING POWER AMPLIFIERS," each of which are herein incorporated by reference in their entireties.

BACKGROUND

Field

Embodiments of the invention relate to electronic systems, and in particular, to radio frequency (RF) electronics.

Description of the Related Technology

RF power amplifiers can be used to boost the power of a RF signal having a relatively low power. Thereafter, the boosted RF signal can be used for a variety of purposes, included driving the antenna of a transmitter.

Power amplifiers can be included in mobile phones to amplify a RF signal for transmission. For example, in mobile phones that communicate using a wireless local area network (WLAN) protocol and/or any other suitable communication standard, a power amplifier can be used to amplify the RF signal. It can be important manage the amplification of a RF signal, as amplifying the RF signal to an incorrect power level can cause a wireless device to transmit out of band.

There is a need for improved power amplifier systems. Furthermore, there is a need for improving power amplifier biasing.

SUMMARY

In certain embodiments, the present disclosure relates to a power amplifier system including a power amplifier configured to amplify a radio frequency (RF) signal and a bias block for biasing the power amplifier. The bias block includes a time dependent signal generator configured to shape an enable signal of the power amplifier to generate a control current, a current amplifier configured to amplify the control current to generate a correction current, and a primary biasing circuit configured to generate a bias current for the power amplifier based at least partly on the correction current. The bias current is configured to correct for a variation in gain of the power amplifier when the power amplifier is enabled.

In several embodiments, the time dependent signal generator includes a resistor-capacitor (RC) network. In accordance with a number of embodiments, the RC network includes a first resistor and a first capacitor electrically connected in series between the current amplifier and an input of the bias circuit configured to receive the enable signal. In several embodiments, the RC network further includes a second resistor having a first end electrically connected to the input of the current mirror and a second end electrically connected to the input of the bias circuit configured to receive the enable signal.

According to certain embodiments, the second resistor has a resistance ranging between about 10 kΩ and about 100 kΩ, the first capacitor has a capacitance ranging between about 10 pF and about 100 pF, and the first resistor has a resistance ranging between about 10 kΩ and about 100 kΩ.

In a number of embodiments, the current amplifier includes a current mirror. In several embodiments, the current mirror includes a first bipolar transistor and a second bipolar transistor, the first bipolar transistor including an emitter electrically connected to an emitter of the second bipolar transistor and to a power low voltage, and a collector electrically connected to a base of the first bipolar transistor and to a base of the second bipolar transistor, the collector of the first bipolar transistor configured to receive at least a portion of the control current. In certain embodiments, the current mirror further includes a resistor, a third bipolar transistor and a fourth bipolar transistor, the third bipolar transistor including an emitter electrically connected to an emitter of the fourth bipolar transistor and to the power low voltage, and a collector electrically connected to a first end of the resistor, to the collector of the second bipolar transistor, to a base of the third bipolar transistor, and to a base of the fourth bipolar transistor, the collector of the fourth bipolar transistor configured to generate the compensation current. In several embodiments, the resistor further includes a second end configured to receive the enable signal.

According to some embodiments, the power amplifier system further includes a transceiver for providing the RF signal to the power amplifier.

In a number of embodiments, the power amplifier includes a bipolar transistor having an emitter, a base and a collector, the base configured to receive the RF signal and the bias current. In certain embodiments, the emitter is electrically connected to a power low voltage and the collector is configured to generate an amplified version of the RF signal.

In several embodiments, the primary bias circuit includes a first resistor, a second resistor, a first bipolar transistor, and a second bipolar transistor, the first resistor including a first end electrically connected to the emitter of the first bipolar transistor at a node configured to receive the correction current, and a second end electrically connected to a first end of the second resistor at a node of the bias circuit configured to receive the enable signal, the second resistor including a second end electrically connected to a collector of the first bipolar transistor, a base of the first bipolar transistor, and to a base of the second bipolar transistor. According to certain embodiments, the second bipolar transistor includes a collector electrically connected to a battery voltage and an emitter configured to generate the bias current. In a number of embodiments, the primary bias circuit further includes a third bipolar transistor having an emitter electrically connected to the power low voltage and a base and a collector electrically connected to the emitter of the first bipolar transistor.

In certain embodiments, the present disclosure relates to a method of biasing a power amplifier. The method includes shaping an enable signal using a time-dependent signal generator to generate a control current, amplifying the control current using a current amplifier to generate a correction current, and generating a bias current for a power amplifier using a primary biasing circuit, the primary biasing circuit configured to use the correction current to correct for a variation in gain of the power amplifier when the power amplifier is enabled.

In a number of embodiments, shaping the enable signal includes using a resistor capacitor (RC) network of the time dependent signal generator. In some embodiments, the RC network includes a first resistor and a first capacitor electrically connected in series, the RC network configured to receive the enable signal and to generate the control current.

In several embodiments, amplifying the control current further includes amplifying the control current using a current mirror of the current amplifier.

In accordance with a number of embodiments, generating the bias current includes shaping the bias current so as to compensate for a gain variation of a heterojunction bipolar transistor (HBT).

In certain embodiments, the present disclosure relates to a bias circuit for biasing a power amplifier. The bias circuit includes a time dependent signal generator configured to shape an enable signal of the power amplifier to generate a control current, a current amplifier configured to amplify the control current to generate a correction current, and a primary biasing block configured to generate a bias current for the power amplifier based at least partly on the correction current. The bias current is configured to correct for a variation in gain of the power amplifier when the power amplifier is enabled.

In several embodiments, the time dependent signal generator includes a resistor-capacitor (RC) network. In a number of embodiments, the RC network includes a first resistor and a first capacitor electrically connected in series between the current amplifier and an input of the bias circuit configured to receive the enable signal.

In accordance with certain embodiments, the current amplifier includes a current mirror.

In several embodiments, the primary bias block includes a first resistor, a second resistor, a first bipolar transistor, and a second bipolar transistor, the first resistor including a first end electrically connected to the emitter of the first bipolar transistor at a node configured to receive the correction current, and a second end electrically connected to a first end of the second resistor at a node of the bias circuit configured to receive the enable signal, the second resistor including a second end electrically connected to a collector of the first bipolar transistor, a base of the first bipolar transistor, and to a base of the second bipolar transistor. In a number of embodiments, the second bipolar transistor includes a collector electrically connected to a battery voltage and an emitter configured to generate the bias current.

DETAILED DESCRIPTION OF EMBODIMENTS

The headings provided herein, if any, are for convenience only and do not necessarily affect the scope or meaning of the claimed invention.

Apparatus and methods for biasing power amplifiers are disclosed herein. In certain implementations, a power amplifier and a power amplifier bias block are provided. The power amplifier can be used to amplify a radio frequency (RF) signal for transmission, and the power amplifier bias block can be used to bias the power amplifier. The power amplifier bias block can receive an enable signal that can be used to enable or disable the power amplifier so as to pulse the power amplifier's output.

In certain implementations, the power amplifier bias block includes a primary biasing circuit and a gain correction block including a time-dependent signal generator and a current amplifier. The time-dependent signal generator or control block can be used to shape the enable signal so as to generate a control current, which can be amplified by the current amplifier to generate a correction current. The power amplifier bias block can generate a bias current for the power amplifier using the primary biasing circuit and the correction current. The correction current can be used to adjust the magnitude of the bias current so as to compensate for a variation in gain of the power amplifier over time when the power amplifier is transitioned from a disabled state to an enabled state. For example, shortly after a power amplifier is enabled, absent compensation the current of a primary biasing circuit can come up slow due to thermal effects, and the power amplifier's gain can be low. By including the time-dependent signal generator and the current amplifier, a current boost can be provided to the power amplifier so as to provide the power amplifier with a substantially flat gain response versus time. Correcting for gain variation in the power amplifier can improve the power amplifier's performance, including, for example, the power amplifier's dynamic error vector magnitude (EVM).

Overview of Power Amplifier Systems

Figure 1:
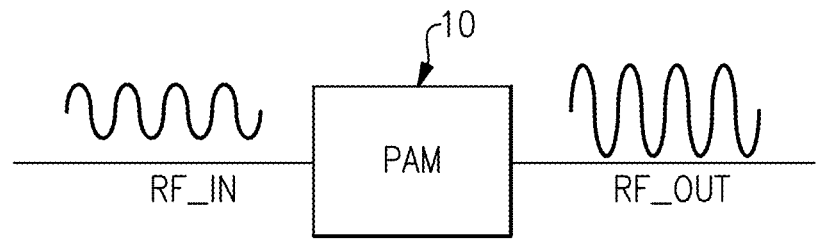
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module (PAM) 10 can be configured to amplify an RF signal RF_IN to generate an amplified RF signal RF_OUT. As described herein, the power amplifier module 10 can include one or more power amplifiers, including, for example, multi-stage power amplifiers.

Figure 2:
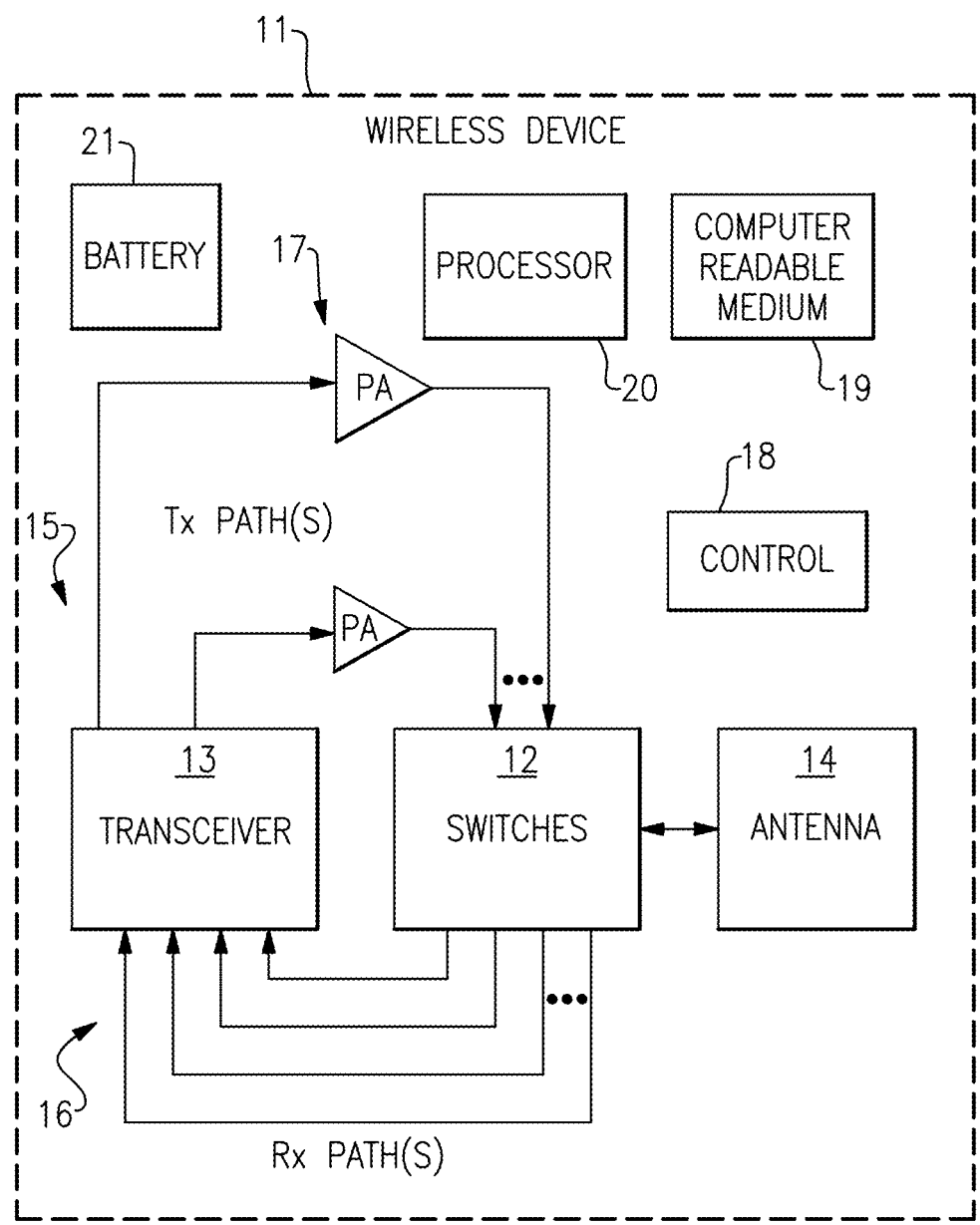
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include power amplifier bias circuits implementing one or more features of the present disclosure.

The example wireless device 11 depicted in FIG. 2 can represent a multi-band and/or multi-mode device such as a multi-band/multi-mode mobile phone. In certain embodiments, the wireless device 11 can include switches 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can be adapted to include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal or any other suitable pulsed signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The battery 21 can be any suitable battery for use in the wireless device 11, including, for example, a lithium-ion battery.

Figure 3A:
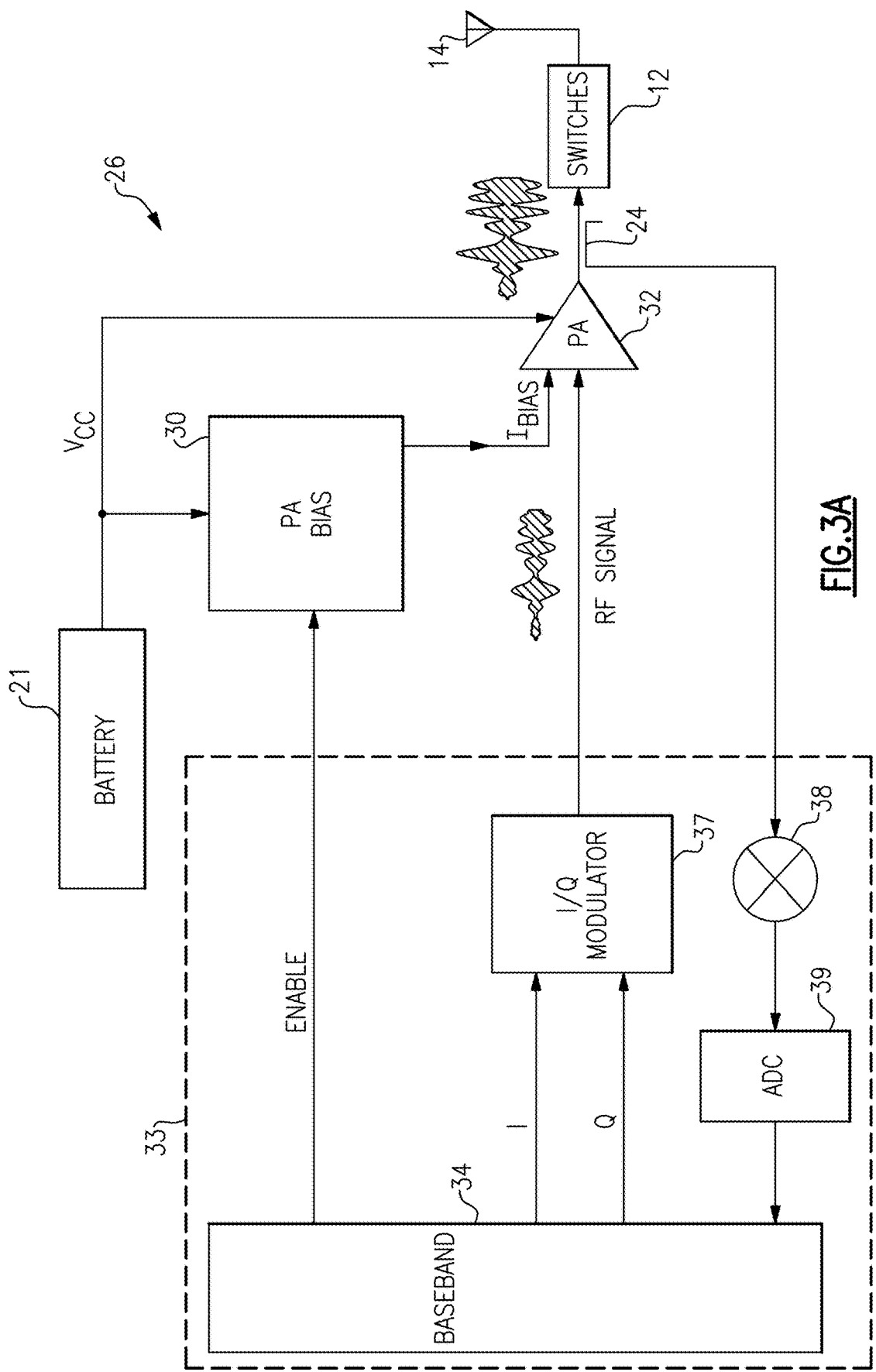
FIG. 3A is a schematic block diagram of one example of a power amplifier system.

FIG. 3A is a schematic block diagram of one example of a power amplifier system 26. The illustrated power amplifier system 26 includes the switches 12, the antenna 14, the battery 21, a directional coupler 24, a power amplifier bias block 30, a power amplifier 32, and a transceiver 33. The illustrated transceiver 33 includes a baseband processor 34, an I/Q modulator 37, a mixer 38, and an analog-to-digital converter (ADC) 39.

The baseband signal processor 34 can be used to generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate a RF signal. For example, the I/Q modulator 37 can include DACs configured to convert the I and Q signals into an analog format, mixers for upconverting the I and Q signals to radio frequency, and a signal combiner for combining the upconverted I and Q signals into a RF signal suitable for amplification by the power amplifier 32. In certain implementations, the I/Q modulator 37 can include one or more filters configured to filter frequency content of signals processed therein.

The power amplifier bias block 30 can receive an enable signal ENABLE from the baseband processor 34 and a battery or power high voltage $V_{CC}$ from the battery 21, and can use the enable signal ENABLE to generate a bias current $I_{BIAS}$ for the power amplifier 32. Although FIG. 3A illustrates the battery 21 directly generating the power high voltage $V_{CC}$, in certain implementations the power high voltage $V_{CC}$ can be a regulated voltage generated by a regulator that is electrically powered using the battery 21. The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the power added efficiency (PAE) and/or linearity of the power amplifier 32.

Figure 3B:
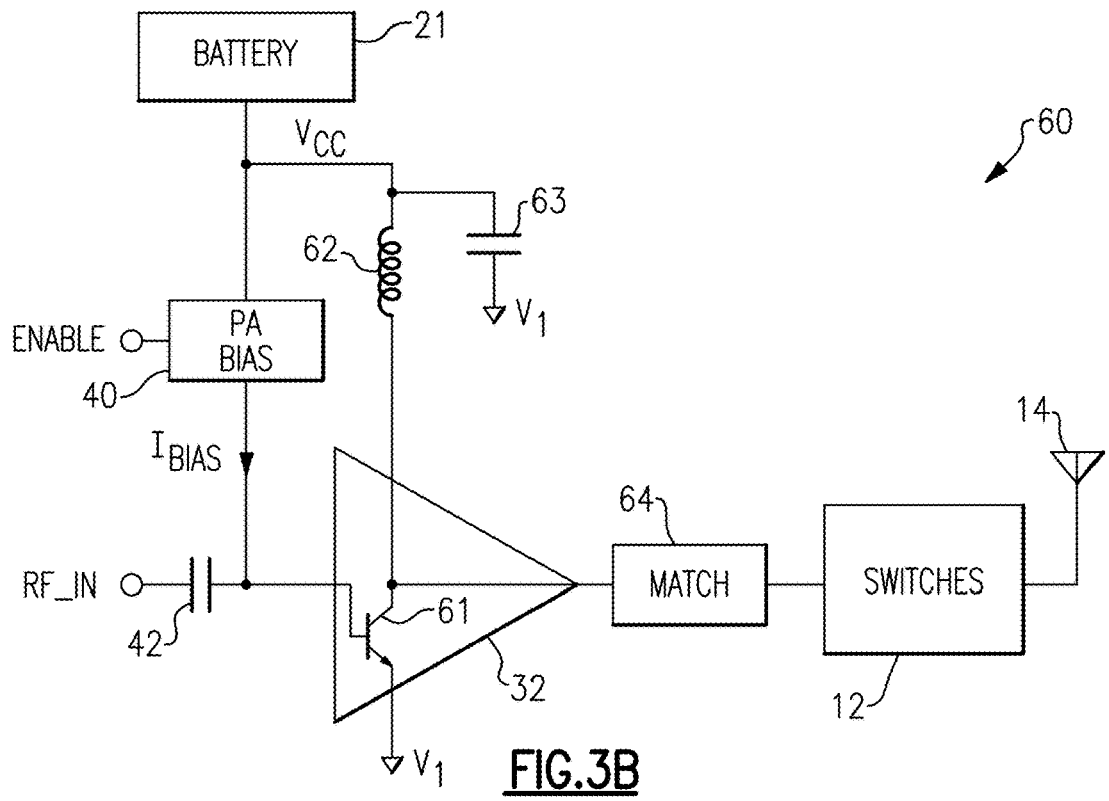
FIG. 3B is a schematic block diagram of another example of a power amplifier system.

FIG. 3B is a schematic block diagram of another example of a power amplifier system 60. The illustrated power amplifier system 60 includes a power amplifier bias block 40, the battery 21, the power amplifier 32, an inductor 62, a first capacitor 63, a second capacitor 42, an impedance matching block 64, the switches 12, and the antenna 14.

The illustrated power amplifier 32 includes a bipolar transistor 61 having an emitter, a base, and a collector. The emitter of the bipolar transistor 61 can be electrically connected to a first or power low voltage $V_1$, which can be, for example, ground, and a radio frequency input signal RF_IN can be provided to the base of the bipolar transistor 61 through the first capacitor 42. The bipolar transistor 61 can amplify the RF input signal RF_IN and provide the amplified RF signal at the collector. The bipolar transistor 61 can be any suitable device. In one implementation, the bipolar transistor 61 is a heterojunction bipolar transistor (HBT).

The power amplifier 32 can be configured to provide the amplified RF signal to the switches 12. The impedance matching block 64 can be used to aid in terminating the electrical connection between the power amplifier 32 and the switches 12. For example, the impedance matching block 64 can be used to increase power transfer and/or reduce reflections of the amplified RF signal.

The inductor 62 can be included to aid in electrically powering the power amplifier 32 with the power high voltage $V_{CC}$ from the battery 21 while choking or blocking high frequency RF signal components. The inductor 62 can include a first end electrically connected to the power high voltage $V_{CC}$ and a second end electrically connected to the collector of the bipolar transistor 61. The first or decoupling capacitor 63 is electrically connected between the power high voltage $V_{CC}$ and the power low voltage $V_1$ and can provide a low impedance path to high frequency signals, thereby reducing the noise of the power high voltage $V_{CC}$, improving power amplifier stability, and/or improving the performance of the inductor 62 as a RF choke.

The power amplifier bias block 40 is configured to receive an enable signal ENABLE and the battery or power high voltage $V_{CC}$. The power amplifier bias block 40 can use the enable signal ENABLE and the battery voltage $V_{CC}$ to generate a bias current $I_{BIAS}$ for biasing the power amplifier 32. For example, as illustrated in FIG. 3B, the power amplifier bias block 40 can be used to generate a bias current $I_{BIAS}$ that can be used to bias the base of the bipolar transistor 61 of the power amplifier 32. The power amplifier bias block 40 can use the enable signal ENABLE to control or vary a magnitude of the bias current $I_{BIAS}$ so as to enable or disable the power amplifier and thereby pulse the power amplifier's output. For example, when the enable signal ENABLE indicates the power amplifier 32 should be activated, the power amplifier bias block 40 can change the amplitude of the bias current $I_{BIAS}$ so as to achieve a desired gain of the power amplifier 32. Similarly, when the enable signal ENABLE indicates that the power amplifier 32 should be deactivated, the power amplifier bias block 40 can decrease the bias current $I_{BIAS}$ such that the gain of the power amplifier 32 is equal to about 0.

Although FIG. 3B illustrates one implementation of the power amplifier 32, skilled artisans will appreciate that the teachings described herein can be applied to a variety of power amplifier structures, including, for example, multi-stage power amplifier structures and/or power amplifiers employing other transistor structures.

Overview of Power Amplifier Bias Circuits

In certain implementations described herein, a power amplifier bias block includes a primary biasing circuit and a gain correction block including a time-dependent signal generator and a current amplifier. The time-dependent signal generator can be used to shape the enable signal of the power amplifier so as to generate a control current, which can be amplified by the current amplifier to generate a correction current. The primary biasing circuit can use the correction current to correct for a variation in gain of the power amplifier that can occur shortly after the power amplifier is enabled. Compensating for gain variation in the power amplifier can improve the power amplifier's performance, including, for example, the power amplifier's dynamic error vector magnitude (EVM).

Including both the current amplifier and the time-dependent signal generator can permit the power amplifier bias block to be included on-die with the power amplifier. For example, by amplifying the control current generated by the time-dependent signal generator, the magnitude of the components of the time-dependent signal generator can be reduced to a size suitable for on-chip integration. In certain implementations, the time-dependent signal generator can include a resistor-capacitor (RC) network, and the current amplifier can be used to amplify the control current so as to reduce a magnitude of the resistor and/or capacitor needed to generate a suitable correction current, thereby permitting the time-dependent signal generator to be integrated on-chip with the power amplifier.

Figure 4:
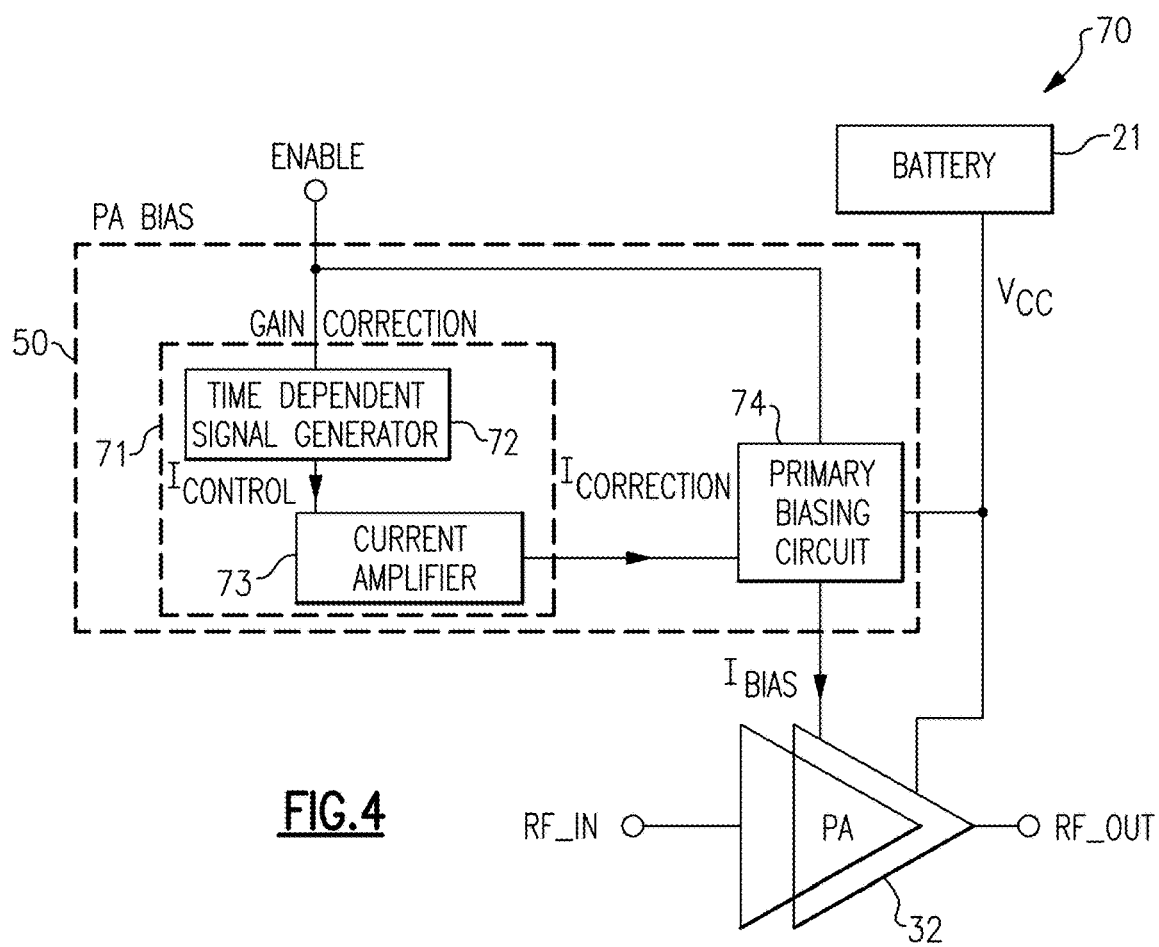
FIG. 4 is a schematic block diagram of one example of a power amplifier system including a power amplifier bias block according to one embodiment.

FIG. 4 is a schematic block diagram of one example of a power amplifier system 70 including a power amplifier bias block 50 according to one embodiment. The illustrated power amplifier system 70 includes the power amplifier bias block 50, the battery 21, and the power amplifier 32. The power amplifier 32 can be a single or multi-stage power amplifier, and in certain implementations can be similar to the power amplifier 32 described above with reference to FIG. 3B. The battery 21 can be any suitable battery, such as a lithium-ion battery, and be used to provide the battery or power high voltage $V_{CC}$ to the power amplifier bias block 50 and to the power amplifier 32. The power amplifier bias block 50 and the power amplifier 32 can be integrated on a single die with one or more other components to form a packaged power amplifier module, which can be, for example, mounted to a RF circuit board associated with the wireless device 11 of FIG. 2.

The power amplifier bias block 50 includes a gain correction block 71 and a primary biasing circuit 74. The gain correction block 71 includes a time-dependent signal generator or control block 72 and a current amplifier 73. The power amplifier bias block 50 can receive an enable signal ENABLE, and use the enable signal ENABLE to generate a bias current $I_{BIAS}$ using charge stored on the battery 21. The bias current $I_{BIAS}$ can be provided to, for example, a base of a bipolar transistor of the power amplifier 32, as was described earlier.

The enable signal ENABLE can be used to control the power amplifier 32 so as to pulse the output of the power amplifier 32. For example, when the power amplifier 32 is configured to transmit a WLAN signal, the enable signal ENABLE can be selectively controlled so as to pulse the output of the power amplifier 32.

The power amplifier 32 can be configured to operate in a relatively noisy environment. For example, a die including the power amplifier 32 and the power amplifier bias block 50 can be provided in an electronic system that includes other electronic components including other power amplifiers, such as power amplifiers amplifying GSM and/or EDGE signals. These electronic components can cause noise on the power high voltage $V_{CC}$. Additionally, the power amplifier 32 can also be exposed to other non-ideal operation conditions. For example, the power amplifier 32 and the power amplifier bias block 50 can be exposed to a thermal gradient, and thus can be at different operating temperatures. Furthermore, the level of the power high voltage $V_{CC}$ can vary depending on a charge of the device that the power amplifier 32 and the power amplifier bias block 50 are used in. The power amplifier bias block 50 can be used to compensate for a gain variation of the power amplifier 32 arising from these sources, as well as from other sources.

The power amplifier bias block 50 includes the time-dependent signal generator 72, which can be used to generate a control current $I_{CONTROL}$ when the enable signal ENABLE is transitioned from a disabled state to an enabled state. The control current $I_{CONTROL}$ can be provided to the current amplifier 73, which can amplify the control current $I_{CONTROL}$ to generate a correction current $I_{CORRECTION}$. The correction current $I_{CORRECTION}$ can be used by the primary biasing circuit 74 to correct for a variation in gain over time that can occur shortly after the power amplifier 32 is enabled. For example, shortly after the power amplifier 32 is enabled, absent compensation the current of the primary biasing circuit 74 can come up slow due to thermal effects, and the gain of the power amplifier 32 can be low. By using the time-dependent signal generator 72 and the current amplifier 73 to provide a transient current boost to the power amplifier 32 after being enabled, the power amplifier 32 can be configured to have a substantially constant gain over time.

By including the current amplifier 73 to amplify the control current $I_{CONTROL}$ generated by the time-dependent signal generator 72, the magnitude of the components of the time-dependent signal generator 72 can be reduced. For example, the current amplifier 73 can be used to amplify the control current $I_{CONTROL}$ so as to reduce a size of a component of the time-dependent signal generator 72 needed to generate a correction current with correct time constant, thereby permitting the time-dependent signal generator to be integrated on-chip with the power amplifier 32.

The primary bias circuit 74 can be configured to generate a relatively constant bias current output that can be adjusted by the correction current $I_{CORRECTION}$ to correct for a variation in gain of the power amplifier 32 that can occur shortly after the power amplifier 32 is enabled. In certain implementations, the primary bias circuit 74 can be a conventional bias circuit that is modified such that the output of the bias circuit is adjusted based on the amplitude of the correction current $I_{CORRECTION}$. Additional detail of the primary bias circuit 74 can be as described later below.

Figure 5:
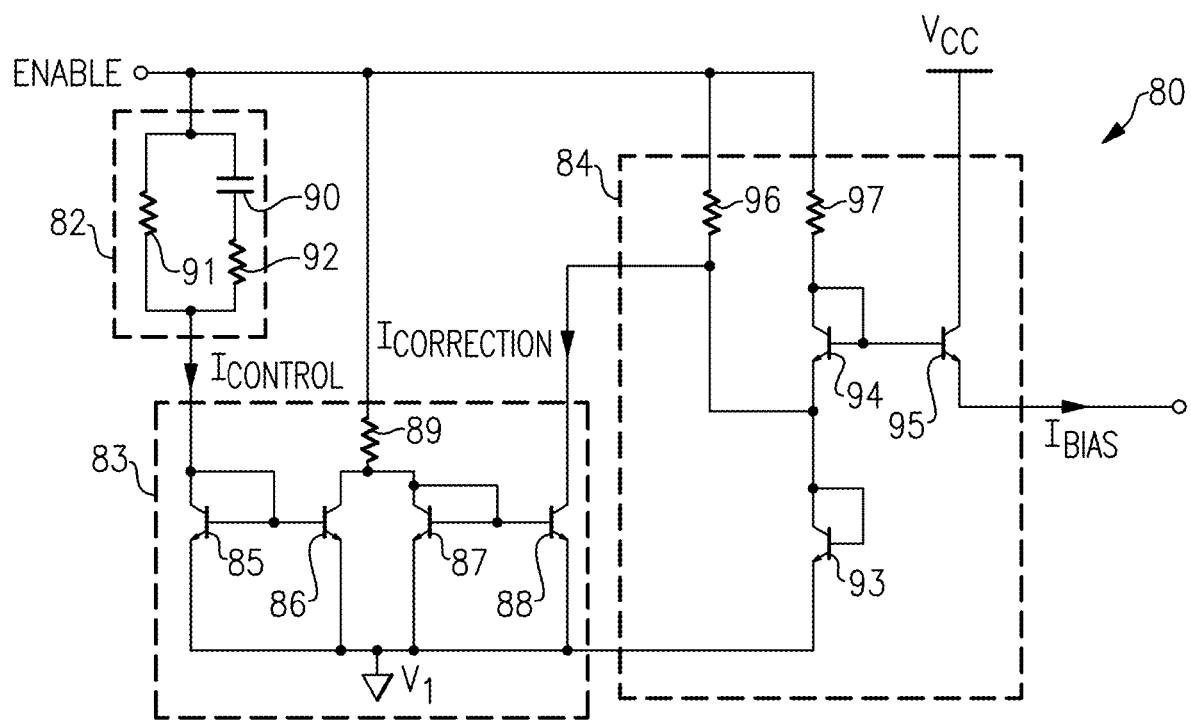
FIG. 5 is a circuit diagram of a power amplifier bias block according to one embodiment.

FIG. 5 is a circuit diagram of a power amplifier bias block 80 according to one embodiment. The power amplifier bias block 80 includes a resistor-capacitor (RC) network 82, a current mirror 83, and a primary bias circuit 84. The RC network 82 operates as a time-dependent signal generator and the current mirror 83 operates as a current amplifier. The power amplifier bias block 80 is configured to receive an enable signal ENABLE and a battery or power high voltage $V_{CC}$, and to generate a bias current $I_{BIAS}$.

The RC network 82 includes a first resistor 91, a second resistor 92, and a capacitor 90. The first resistor 91 includes a first end electrically connected to a first end of the capacitor 90 at an input of the RC network 82 configured to receive the enable signal ENABLE. The first resistor 91 further includes a second end electrically connected to a first end of the second resistor 92 at an output of the RC network 82 configured to provide the control current $I_{CONTROL}$ to the current mirror 83. The second resistor 92 further includes a second end electrically connected to a second end of the capacitor 90.

The RC network 82 can be used to shape the enable signal ENABLE so as to generate the control current $I_{CONTROL}$. For example, the capacitor 90 and the second resistor 92 can have an RC time-constant selected to achieve the desired shape of the control current $I_{CONTROL}$. The RC time-constant can be selected based on a system parameter of the electronic system that the power amplifier bias block 80 is used in, including, for example, a transition time of the enable signal ENABLE. In certain implementations, the time-constant of the second resistor 92 and the capacitor 90 is in the range of about 0.1 kΩ to about 10 kΩ for example, about 1 μs.

In certain implementations, the capacitor 90 has a capacitance ranging between about 10 pF to about 50 pF, for example, about 25 pF. The second resistor 92 can have any suitable resistance, including, for example, a resistance in the range of about 10 kΩ to about 100 kΩ, for example, about 50 kΩ. Although one implementation of the capacitor 90 and the second resistor 92 is illustrated, other configurations are possible. For example, the order of the second resistor 92 and the capacitor 90 in the series combination of the second resistor 92 and the capacitor 90 can be reversed. The first resistor 91 can have any suitable value, including, for example, a resistance in the range of about 1 kΩ to about 20 kΩ, for example, about 10 kΩ. In certain implementations, such as the implementation shown in FIG. 9, the first resistor 91 can be omitted.

To aid in reducing the area of the RC network 82, the current mirror 83 can be used to amplify the control current $I_{CONTROL}$ to generate the correction current $I_{CORRECTION}$. Thus, the amplifier 83 can be used to obtain a correction current $I_{CORRECTION}$ of a suitable magnitude, while reducing the size of the components of the RC network 82 relative to a scheme omitting a current amplifier. By amplifying the control current $I_{CONTROL}$ in this manner, the power amplifier bias block 80 can be integrated on-chip with a power amplifier without having to use a relatively large resistor, which may not provide enough current variation to provide suitable gain compensation.

The illustrated current mirror 83 includes a first NPN bipolar transistor 85, a second NPN bipolar transistor 86, a third NPN bipolar transistor 87, a fourth NPN bipolar transistor 88, and a resistor 89. The first NPN bipolar transistor 85 includes an emitter electrically connected to the first or power low voltage $V_1$, which can be, for example, ground, and a base and a collector electrically connected to a base of the second NPN bipolar transistor 86 at an input of the current mirror 83 configured to receive the control current $I_{CONTROL}$. The second NPN bipolar transistor 86 further includes an emitter electrically connected to the power low voltage $V_1$, and a collector electrically connected to a first end of the resistor 89, to a base of the fourth NPN bipolar transistor 88, and to a base and a collector of the third NPN bipolar transistor 87. The third and fourth NPN bipolar transistors 87, 88 each include an emitter electrically connected to the power low voltage $V_1$. The resistor 89 includes a second end configured to receive the enable signal ENABLE. The fourth NPN bipolar transistor 88 further includes a collector configured to generate the correction current $I_{CORRECTION}$.

The resistor 89 can have any suitable resistance, including, for example, a resistance selected based on the voltage level of power amplifier enable signal ENABLE and/or system requirements. In certain implementations, the resistor 89 has a resistance ranging between about 10 kΩ to about 50 kΩ, for example, about 20 kΩ. By electrically connected the second end of the resistor 89 to the enable signal ENABLE, the power consumption of the power amplifier bias block 80 can be reduced when the enable signal ENABLE is low. However, in other implementations, the current mirror 83 can be configured in other ways.

The current mirror 83 can have any suitable gain. In one implementation, the current mirror 83 is configured to amplify the control current $I_{CONTROL}$ by a factor ranging between about 5 to about 50, for example, about 10. As used herein, the term current mirror can refer to current amplification circuits including a plurality of current mirrors combined (e.g., cascaded) to achieve a target gain.

The primary bias circuit 84 can be used to generate a bias current $I_{BIAS}$ for a power amplifier, such as the power amplifier 32 of FIG. 4. The illustrated primary bias circuit 84 includes a first resistor 96, a second resistor 97, a first NPN bipolar transistor 93, a second NPN bipolar transistor 94 and a third NPN bipolar transistor 95. The first resistor 96 includes a first end electrically connected to a first end of the second resistor 97 at an input of the primary bias circuit 84 configure to receive the enable signal ENABLE. The first resistor 96 further includes a second end electrically connected to an emitter of the second NPN bipolar transistor 94 and to a base and a collector of the first NPN bipolar transistor 93 at an input of the primary bias circuit 84 configured to receive the correction current $I_{CORRECTION}$. The first NPN bipolar transistor 93 further includes an emitter electrically connected to the power low voltage $V_1$. The second resistor 97 further includes a second end electrically connected to a base and a collector of the second NPN bipolar transistor 94 and to a base of the third NPN bipolar transistor 95. The third NPN bipolar transistor 95 further includes a collector electrically connected to the power high voltage $V_{CC}$ and an emitter configured to generate the bias current $I_{BIAS}$.

The first NPN bipolar transistor 93 can aid in level-shifting the voltage of the emitter of the second NPN bipolar transistor 94, which in turn can impact the emitter voltage of the third NPN bipolar transistor 95. Thus, inclusion of the first NPN bipolar transistor 93 can aid in establishing suitable DC operating voltage levels of the power amplifier bias block 80.

The first and second resistors 96, 97 can be tuned to control the steady-state amplitude of the bias current $I_{BIAS}$ when the enable signal ENABLE is activated. For example, the current through the second NPN bipolar transistor 94 can be established using the first and second resistors 96, 97, and can be mirrored using the third NPN bipolar transistor 95 to generate the bias current $I_{BIAS}$.

After the enable signal ENABLE becomes activated, the RC network 82 can generate a control current $I_{CONTROL}$ that can be amplified by the current mirror 83 to generate the correction current $I_{CORRECTION}$. As illustrated in FIG. 5, the correction current $I_{CORRECTION}$ can be used to vary or change the current through the second NPN bipolar transistor 94. For example, when the correction current $I_{CORRECTION}$ decreases, the current through the second NPN bipolar transistor 94 can increase, which in turn can increase the bias current $I_{BIAS}$ generated using the third NPN bipolar transistor 95. The second NPN bipolar transistor 94 can also aid in reversing the direction of the correction current $I_{CORRECTION}$ so that it is suitable to be provided to the base of the fifth NPN bipolar transistor 95. Although one variation of a primary bias circuit is illustrated, other implementations can be used.

Figure 6:
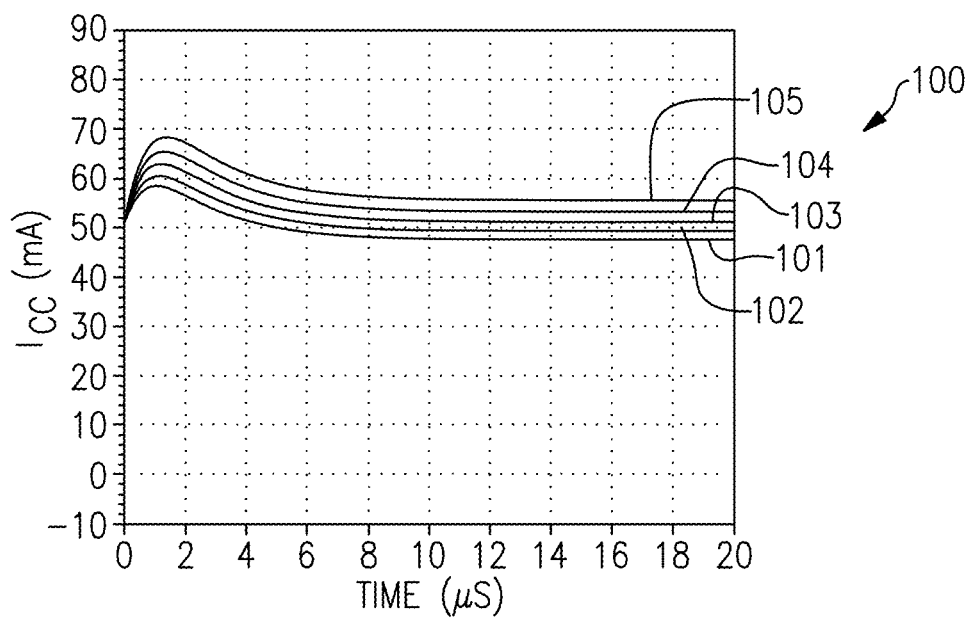
FIG. 6 is a graph of one example of collector current versus time.

FIG. 6 is a graph 100 of one example of collector current versus time. The graph 100 begins at a time zero that is associated with enabling a power amplifier. The graph 100 includes a first plot 101, a second plot 102, a third plot 103, a fourth plot 104 and a fifth plot 105, which correspond to different battery voltage values. In particular, the first, second, third, fourth, and fifth plots 101-105 correspond to battery voltage values of about 3.2 V, about 3.4 V, about 3.6 V, about 3.8 V, and about 4.0 V, respectively.

In certain implementations described herein, a time-dependent signal generator is used to generate a signal that can be used to adjust a power amplifier's bias current during a time period within about 8 μs after the power amplifier is enabled. Thereafter the power amplifier's bias current can be substantially constant until the power amplifier's enable signal is deactivated. In certain implementations, the power amplifier's bias current can vary by more than about 50% during the initial time period that the correction current is used to adjust the power amplifier's bias current.

Figure 7A:
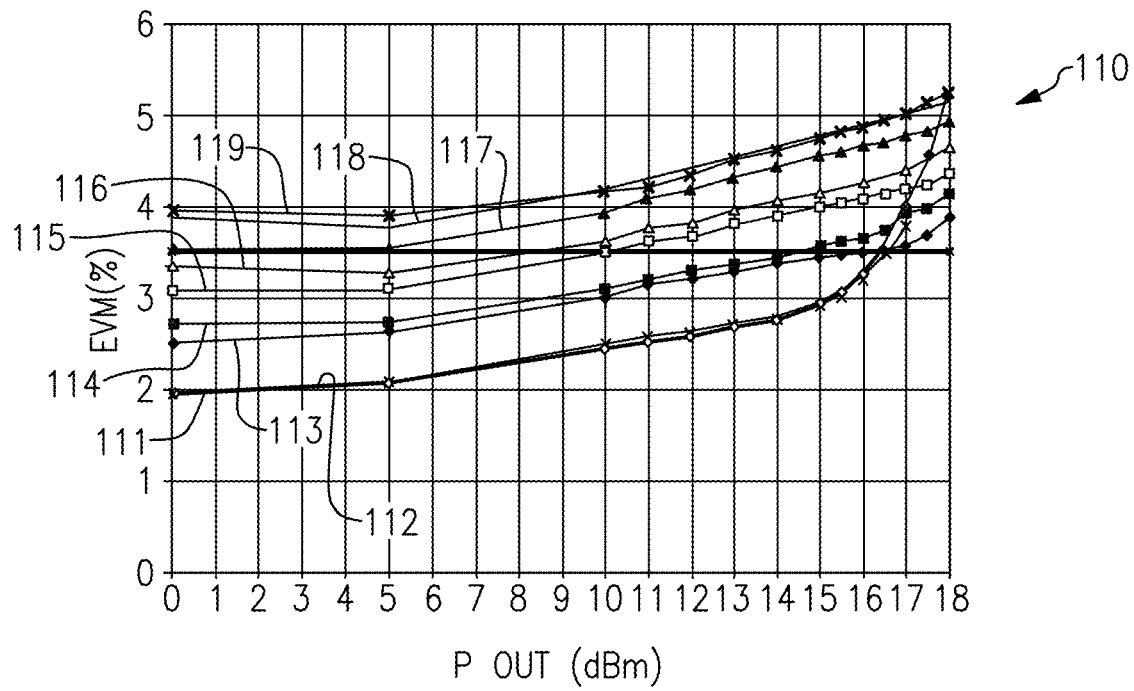
FIG. 7A is a graph of one example of dynamic error vector magnitude (EVM) versus output power.

FIG. 7A is a graph 110 of one example of dynamic error vector magnitude (EVM) versus output power. The graph 110 is for one example of a power amplifier bias block that does not include a time-dependent signal generator and a current amplifier. The graph 110 includes plots of EVM versus output power for a variety of different battery voltage levels. For example, the graph 110 includes plots 111-119, which correspond to battery voltages ranging between about 3.2 V and about 4.2 V.

Figure 7B:
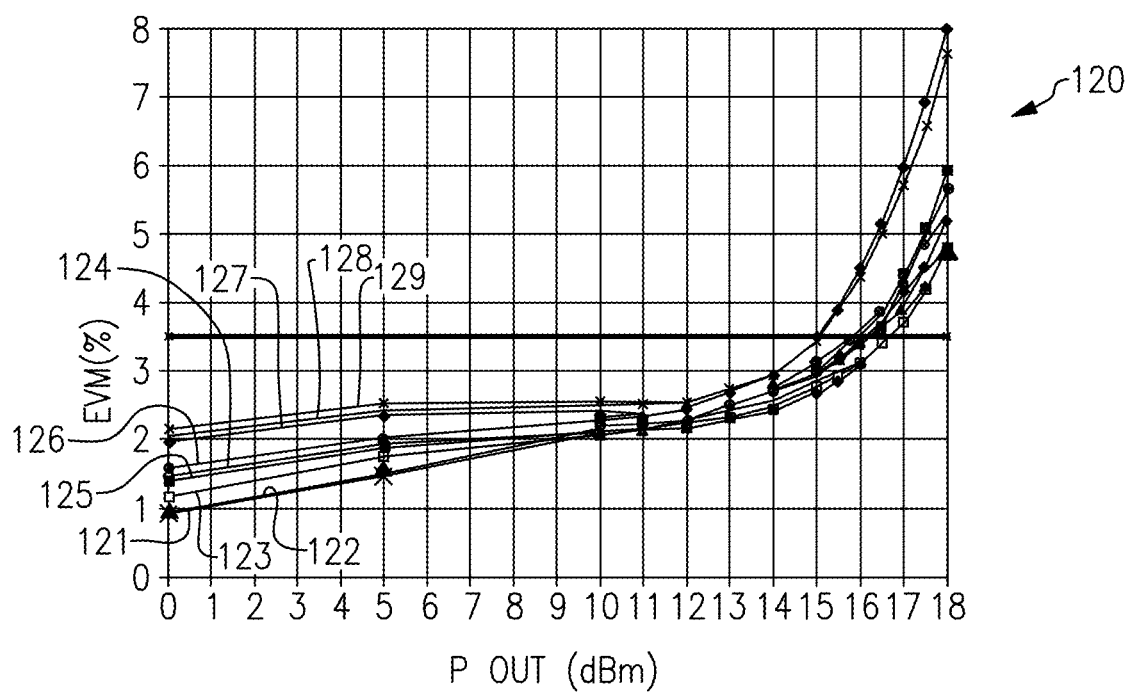
FIG. 7B is a graph of another example of dynamic EVM versus output power.

FIG. 7B is a graph 120 of another example of dynamic EVM versus output power. The graph 120 is for one implementation of a power amplifier bias block that includes a time-dependent signal generator and a current amplifier. The graph 120 includes plots of EVM versus output power for a variety of different battery voltage levels. For example, the graph 120 includes plots 121-129, which correspond to battery voltages between about 3.2 V and about 4.2 V. The graph 120 shows that the EVM of the power amplifier system can be improved by including the time-dependent signal generator and the current amplifier.

Figure 8:
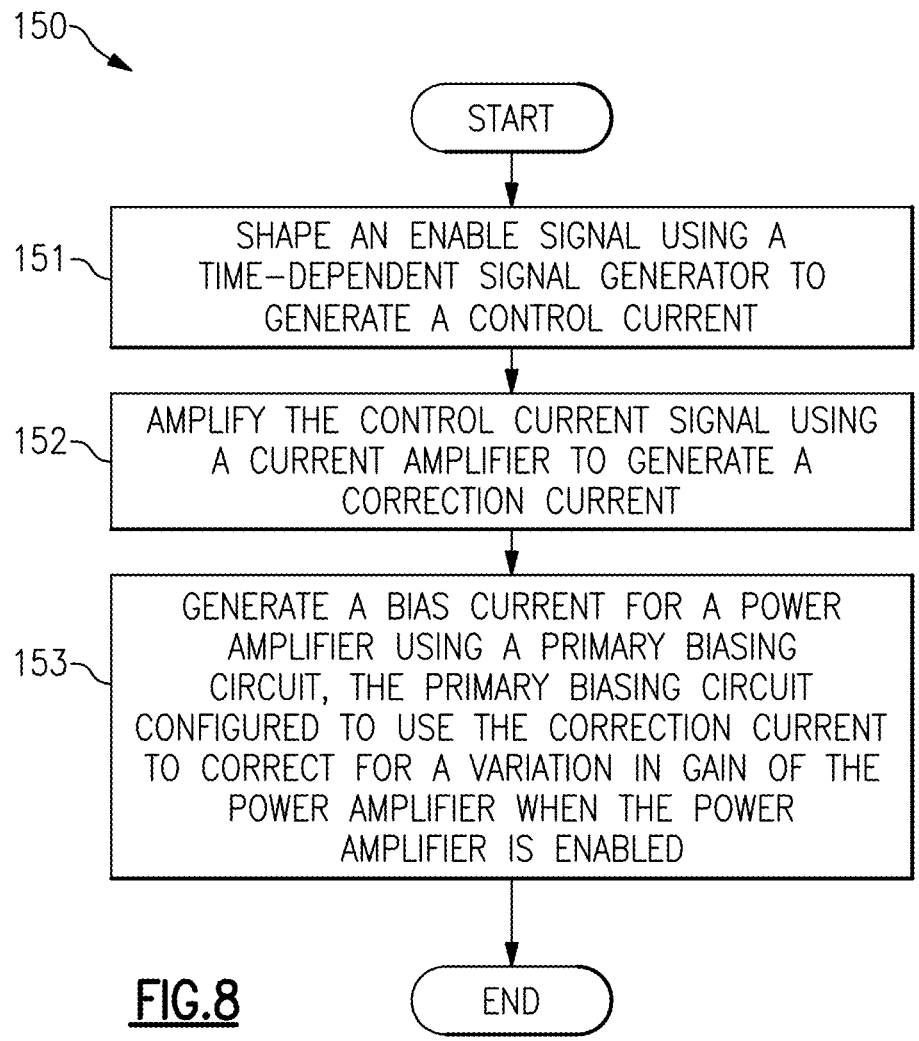
FIG. 8 is a flow chart illustrating a method for biasing a power amplifier in accordance with one embodiment.

FIG. 8 is a flow chart illustrating a method 150 for biasing a power amplifier in accordance with one embodiment. It will be understood that the method 150 can include greater or fewer operations and the operations may be performed in any order, as necessary.

The method 150 starts at a block 151, in which an enable signal of a power amplifier is shaped using a time-dependent signal generator to generate a control current. The power amplifier can be any suitable power amplifier, such as a power amplifier configured to amplify a WLAN signal. In certain implementations, the time-dependent signal generator includes a resistor-capacitor (RC) network configured to generate a transient control current that begins after an enable signal of the power amplifier is activated. In certain implementations, the transient control current reaches a steady-state value within about 8 μs after the enable signal is activated. In certain implementations, the steady-state value of the transient control current can be about 0 mA.

In an ensuing block 152, the control current is amplified using the current amplifier to generate a correction current. In certain implementations, the current amplifier amplifies the correction circuit by a factor ranging between about 5 to about 50. The current amplifier can aid the time-dependent signal generator in shaping the enable signal by reducing the size of the circuit components of the time-dependent signal generator needed to achieve a desired time constant associated with gain compensation.

The method 150 continues at a block 153, in which a bias current for the power amplifier is generated using the primary biasing circuit. The primary biasing circuit is configured to use the correction current to generate a bias current for the power amplifier so as correct for a variation in gain of the power amplifier when the power amplifier is enabled. For example, the primary biasing circuit can be configured to adjust the amplitude of the bias current based on the correction current, such as by adding the correction current to a nominal bias current value.

Figure 9:
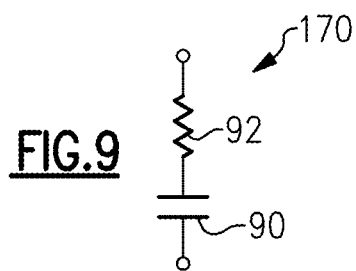
FIG. 9 is a circuit diagram of a time-dependent signal generator in accordance with one embodiment.

FIG. 9 is a circuit diagram of a time-dependent signal generator 170 in accordance with one embodiment. The time-dependent signal generator 170 includes a resistor 92 and a capacitor 90, which can be similar to the resistor 92 and the capacitor 90 of the time-dependent signal generator 82 of FIG. 5. However, in contrast to the time-dependent signal generator 82 of FIG. 5, the time-dependent signal generator 170 of FIG. 9 does not include the resistor 91 of FIG. 4. In certain implementations, the time-constant of the resistor 92 and the capacitor 90 is in the range of about 0.1 μs to about 10 μs, for example, about 1 μs.

Figure 10A:
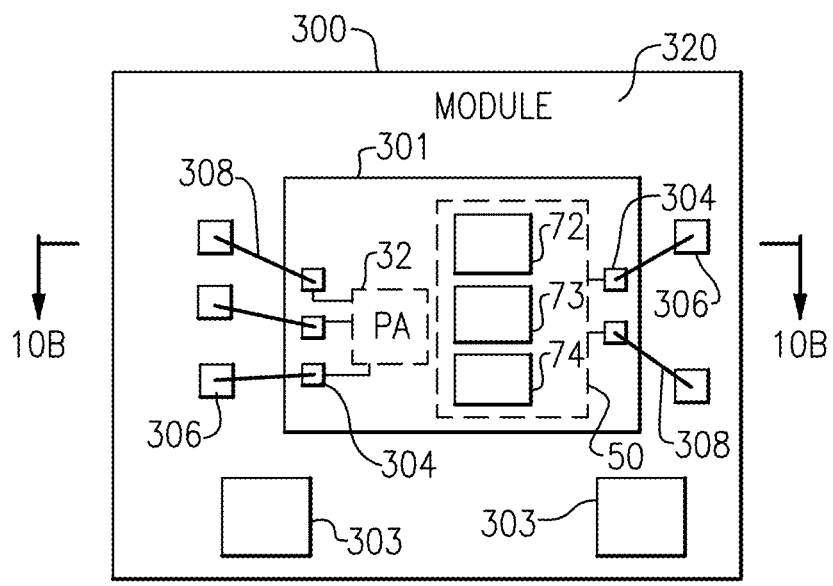
FIG. 10A is a schematic diagram of one example of a packaged power amplifier module.
Figure 10B:
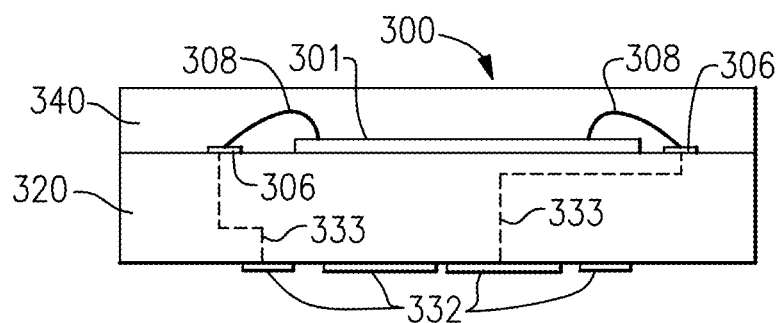
FIG. 10B is a schematic diagram of a cross-section of the packaged power amplifier module of FIG. 10A taken along the lines 10B-10B.

FIG. 10A is a schematic diagram of one example of a packaged power amplifier module 300. FIG. 10B is a schematic diagram of a cross-section of the packaged power amplifier module 300 of FIG. 10A taken along the lines 10B-10B.

The packaged power amplifier module 300 includes an IC or die 301, surface mount components 303, wirebonds 308, a package substrate 320, and encapsulation 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 10A and 10B, the die 301 includes the power amplifier 32 and the power amplifier bias block 50 formed therein. The power amplifier bias block 50 includes the time dependent signal generator 72, the current amplifier 73, and the primary biasing circuit 74. In certain implementations, the time-dependent signal generator 72 can include a resistor-capacitor (RC) network, and the current amplifier 73 can be used to amplify a control current from the RC network to generate a correction current, which can be used by the primary biasing circuit 74 to generate a bias current for the power amplifier 32 that corrects for a gain variation of the power amplifier 32 associated with transitioning the power amplifier from a disabled state to an enabled state. Using the current amplifier 73 to amplify the control current from the time-dependent signal generator 72 can reduce a magnitude of the resistor and/or capacitor needed to generate a suitable correction current, thereby permitting the time-dependent signal generator 72 to be integrated on-chip with the power amplifier 32, as shown in FIG. 10A.

The packaging substrate 320 can be configured to receive a plurality of components such as the die 301 and the surface mount components 303, which can include, for example, surface mount capacitors and/or inductors.

As shown in FIG. 10B, the packaged power amplifier module 300 is shown to include a plurality of contact pads 332 disposed on the side of the packaged power amplifier module 300 opposite the side used to mount the die 301. Configuring the packaged power amplifier module 300 in this manner can aid in connecting the packaged power amplifier module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 10B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged power amplifier module 300 can also include one or more packaging structures to, for example, provide protection and/or to facilitate handling of the packaged power amplifier module 300. Such a packaging structure can include overmold or encapsulation 340 formed over the packaging substrate 320 and the components and die(s) disposed thereon.

It will be understood that although the packaged power amplifier module 300 is described in the context of wirebond-based electrical connections, one or more features of the present disclosure can also be implemented in other packaging configurations, including, for example flip-chip configurations.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged module comprising:
a package substrate; and
an integrated circuit die attached to the package substrate and including a power amplifier configured to amplify a radio frequency signal and a bias circuit configured to receive a power amplifier enable signal, the bias circuit including a gain correction circuit configured to generate a correction current in response to activation of the power amplifier enable signal, and a primary biasing circuit configured to receive the correction current at a first node and to generate a bias signal that biases the power amplifier, the primary biasing circuit including a first bipolar transistor having a collector electrically connected to the first node and a second bipolar transistor having an emitter electrically connected to the first node, the gain correction circuit including a time dependent signal generator configured to generate a control current in response to activation of the power amplifier enable signal, and a current amplifier configured to generate the correction current by amplifying the control current.

2. The packaged module of claim 1 wherein the bias circuit is configured to receive the power amplifier enable signal at a second node, the primary biasing circuit further including a first resistor electrically connected between the first node and the second node.

3. The packaged module of claim 2 wherein the primary biasing circuit further includes a second resistor electrically connected between the second node and a collector of the second bipolar transistor.

4. The packaged module of claim 1 wherein the bias circuit is configured to receive the power amplifier enable signal at a second node, the primary biasing circuit further including a resistor electrically connected in series with the second bipolar transistor and the first bipolar transistor between the second node and ground.

5. The packaged module of claim 1 wherein the primary biasing circuit further includes a third bipolar transistor including a base electrically connected to a base of the second bipolar transistor and an emitter configured to output the bias signal.

6. The packaged module of claim 1 wherein the first bipolar transistor further has a base electrically connected to the first node.

7. The packaged module of claim 1 wherein the first bipolar transistor further has an emitter electrically connected to ground.

8. A wireless device comprising:
a transceiver configured to configured to generate a radio frequency signal;
a power amplifier configured to amplify the radio frequency signal, the power amplifier configured to receive a bias signal that biases the power amplifier; and
a bias circuit configured to receive a power amplifier enable signal, the bias circuit including a gain correction circuit configured to generate a correction current in response to activation of the power amplifier enable signal, and a primary biasing circuit configured to receive the correction current at a first node and to generate the bias signal, the primary biasing circuit including a first bipolar transistor having a collector electrically connected to the first node and a second bipolar transistor having an emitter electrically connected to the first node, the gain correction circuit including a time dependent signal generator configured to generate a control current in response to activation of the power amplifier enable signal, and a current amplifier configured to generate the correction current by amplifying the control current.

9. The wireless device of claim 8 wherein the transceiver is configured to generate the power amplifier enable signal.

10. The wireless device of claim 8 wherein the bias circuit is configured to receive the power amplifier enable signal at a second node, the primary biasing circuit further including a first resistor electrically connected between the first node and the second node.

11. The wireless device of claim 10 wherein the primary biasing circuit further includes a second resistor electrically connected between the second node and a collector of the second bipolar transistor.

12. The wireless device of claim 8 wherein the primary biasing circuit further includes a third bipolar transistor including a base electrically connected to a base of the second bipolar transistor and an emitter configured to output the bias signal.

13. The wireless device of claim 8 wherein the first bipolar transistor further has a base electrically connected to the first node.

14. The wireless device of claim 8 wherein the first bipolar transistor further has an emitter electrically connected to ground.

15. A method of power amplifier biasing, the method comprising:
generating a radio frequency signal using a transceiver;
amplifying the radio frequency signal using a power amplifier;
generating a correction current in response to activation of a power amplifier enable signal using a gain correction circuit, including generating a control current in response to activation of the power amplifier enable signal using a time dependent signal generator, and generating the correction current by amplifying the control current using a current amplifier;
providing the correction current to an input node of a primary biasing circuit, the primary biasing circuit including a first bipolar transistor having a collector electrically connected to the input node and a second bipolar transistor having an emitter electrically connected to the input node; and
biasing the power amplifier using a bias signal outputted from the primary biasing circuit.

16. The method of claim 15 further comprising generating the power amplifier enable signal using the transceiver.

17. The method of claim 15 further comprising outputting the bias signal from an emitter of a third bipolar transistor of the primary biasing circuit, the third bipolar transistor having a base electrically connected to a base of the second bipolar transistor.

18. The method of claim 15 further comprising pulsing an output of the power amplifier using the power amplifier enable signal, the radio frequency signal corresponding to a wireless local area network signal.

19. The method of claim 15 further comprising providing the power amplifier enable signal to an input of the primary biasing circuit.

20. The method of claim 15 wherein biasing the power amplifier using the bias signal includes compensating for a variation in gain of the power amplifier over time.

* * * * *